(12) United States Patent
Yosui

(10) Patent No.: US 10,225,928 B2
(45) Date of Patent: Mar. 5, 2019

(54) FLEXIBLE BOARD AND ELECTRONIC DEVICE

(71) Applicant: Murata Manufacturing Co., Ltd., Nagaokakyo-shi, Kyoto-fu (JP)

(72) Inventor: Kuniaki Yosui, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 229 days.

(21) Appl. No.: 15/158,760

(22) Filed: May 19, 2016

(65) Prior Publication Data
US 2016/0270211 A1   Sep. 15, 2016

Related U.S. Application Data

(63) Continuation of application No. PCT/JP2015/063332, filed on May 8, 2015.

(30) Foreign Application Priority Data

Jun. 4, 2014   (JP) .................................. 2014-115363

(51) Int. Cl.
*H05K 1/02* (2006.01)
*H01P 1/02* (2006.01)
(Continued)

(52) U.S. Cl.
CPC ............... *H05K 1/028* (2013.01); *H01P 1/02* (2013.01); *H01P 1/2039* (2013.01); *H01P 3/08* (2013.01); *H01P 3/082* (2013.01); *H04M 1/0277* (2013.01); *H05K 1/025* (2013.01); *H05K 1/0237* (2013.01); *H05K 1/0225* (2013.01); *H05K 1/147* (2013.01); *H05K 2201/0129* (2013.01)

(58) Field of Classification Search
CPC ... H04M 1/0277; H05K 1/028; H05K 1/0237; H05K 1/025; H05K 1/0225; H05K 1/147; H05K 2201/0129; H01P 1/02; H01P 1/2039; H01P 3/08; H01P 3/082
USPC ......................................................... 361/749
See application file for complete search history.

(56) References Cited

U.S. PATENT DOCUMENTS

| 2012/0274423 A1* | 11/2012 | Kato | .................... H01P 1/20363 333/238 |
| 2013/0127560 A1* | 5/2013 | Kato | .................... H05K 1/0225 333/12 |
| 2015/0201492 A1* | 7/2015 | Kim | ........................ H05K 1/028 361/749 |

FOREIGN PATENT DOCUMENTS

| JP | 3-276789 A | 12/1991 |
| JP | 6-97707 A | 4/1994 |

(Continued)

OTHER PUBLICATIONS

Official Communication issued in International Patent Application No. PCT/JP2015/063332, dated Jul. 21, 2015.

*Primary Examiner* — Michael P McFadden
(74) *Attorney, Agent, or Firm* — Keating & Bennett, LLP

(57) ABSTRACT

A flexible board includes a flexible body including a first principal surface and a second principal surface, and a linear conductor provided in the body and closer to the first principal surface than to the second principal surface. The body is bent inwardly with respect to the first principal surface along an inward bending line crossing the linear conductor and also outwardly with respect to the first principal surface along an outward bending line crossing the linear conductor. The inward bend of the body has a larger mean curvature radius than the outward bend of the body.

19 Claims, 12 Drawing Sheets

(51) Int. Cl.
*H01P 1/20* (2006.01)
*H01P 3/08* (2006.01)
*H04M 1/02* (2006.01)
*H01P 1/203* (2006.01)
*H05K 1/14* (2006.01)

(56) References Cited

FOREIGN PATENT DOCUMENTS

| | | |
|---|---|---|
| JP | 6-338185 A | 12/1994 |
| JP | 2014-86655 A | 5/2014 |
| WO | 2012/073591 A1 | 6/2012 |

\* cited by examiner

FLEXIBLE BOARD AND ELECTRONIC DEVICE

This application is based on Japanese Patent Application No. 2014-115363 filed on Jun. 4, 2014, and International Application No. PCT/JP2015/063332 filed on May 8, 2015, the entire content of each of which is incorporated herein by reference.

BACKGROUND OF THE INVENTION

1. Field of the Invention

The present invention relates to flexible boards and electronic devices, more particularly to a flexible board including a flexible body and a linear conductor provided therein and an electronic device including the same.

2. Description of the Related Art

As an invention relevant to a conventional flexible board, a high-frequency signal line described in, for example, International Publication WO 2012/073591 is known. The high-frequency signal line includes a dielectric element assembly, a signal line, and two ground conductors. The dielectric element assembly is formed by stacking a plurality of dielectric sheets. The signal line is provided in the dielectric element assembly. The two ground conductors are opposed to each other with respect to the signal line in the stacking direction. Accordingly, the signal line and the two ground conductors form a stripline structure.

Furthermore, one of the ground conductors has a plurality of openings overlapping with the signal line when viewed in a plan view in the stacking direction. As a result, less capacitance is created between the signal line and the ground conductor. Therefore, it is possible to shorten the distance between the signal line and the ground conductor in the stacking direction, resulting in a thinner high-frequency signal line. Such a high-frequency signal line is used, for example, to connect two circuit boards.

Incidentally, in the high-frequency signal line disclosed in International Publication WO 2012/073591, the dielectric element assembly is flexible and therefore is bent for use. FIG. 12 is a cross-sectional structure view illustrating a bent portion of the high-frequency signal line 510 disclosed in International Publication WO 2012/073591. FIG. 12 only shows the dielectric element assembly 512 and the signal line 520.

When the high-frequency signal line 510 is bent into an L-shaped shape, as shown in FIG. 12, a portion of the signal line 520 to the left of the bend and a portion of the signal line 520 below the bend are positioned closer to each other. Accordingly, floating capacitance is generated between the portions of the signal line 520 to the left of and below the bend. Such floating capacitance leads to the characteristic impedance of the high-frequency signal line 510 at the bend varying from a target impedance value.

SUMMARY OF THE INVENTION

A flexible board according to a preferred embodiment of the present invention includes a flexible body including a first principal surface and a second principal surface, and a linear conductor provided in the body and positioned closer to the first principal surface than to the second principal surface. The body is bent inwardly with respect to the first principal surface along an inward bending line crossing the linear conductor and also outwardly with respect to the first principal surface along an outward bending line crossing the linear conductor. The inward bend of the body has a larger mean curvature radius than the outward bend of the body.

An electronic device according to another preferred embodiment of the present invention includes a housing and a flexible board accommodated in the housing. The flexible board includes a flexible body including a first principal surface and a second principal surface, and a linear conductor provided in the body so as to be positioned closer to the first principal surface than to the second principal surface. The body is bent inwardly with respect to the first principal surface along an inward bending line crossing the linear conductor and also outwardly with respect to the first principal surface along an outward bending line crossing the linear conductor. The inward bend of the body has a larger mean curvature radius than the outward bend of the body.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, high-frequency signal lines and electronic devices according to preferred embodiments of the present invention will be described with reference to the drawings.

Figure 1:
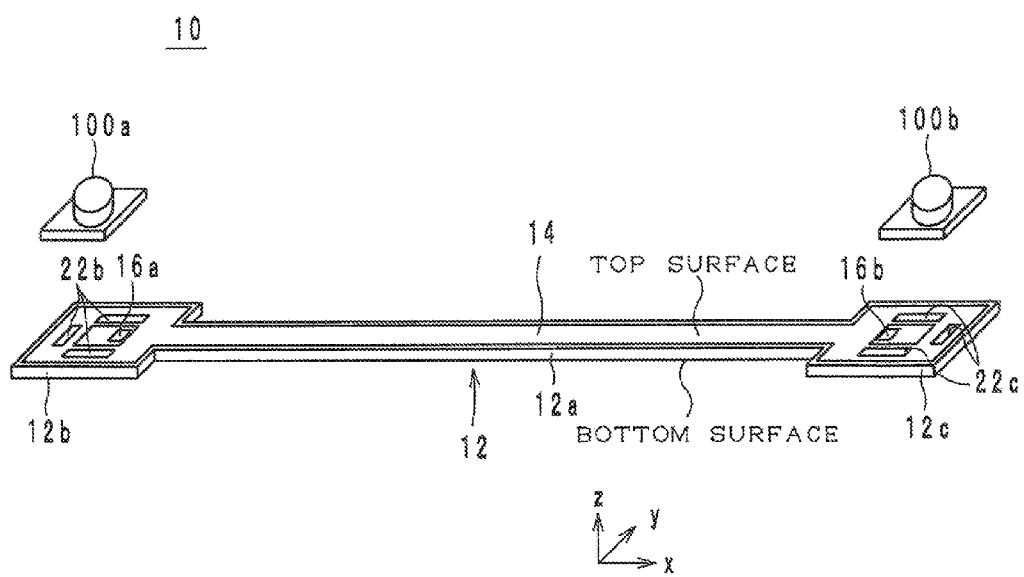
FIG. 1 is an external oblique view of a high-frequency signal line according to a preferred embodiment of the present invention.
Figure 2:
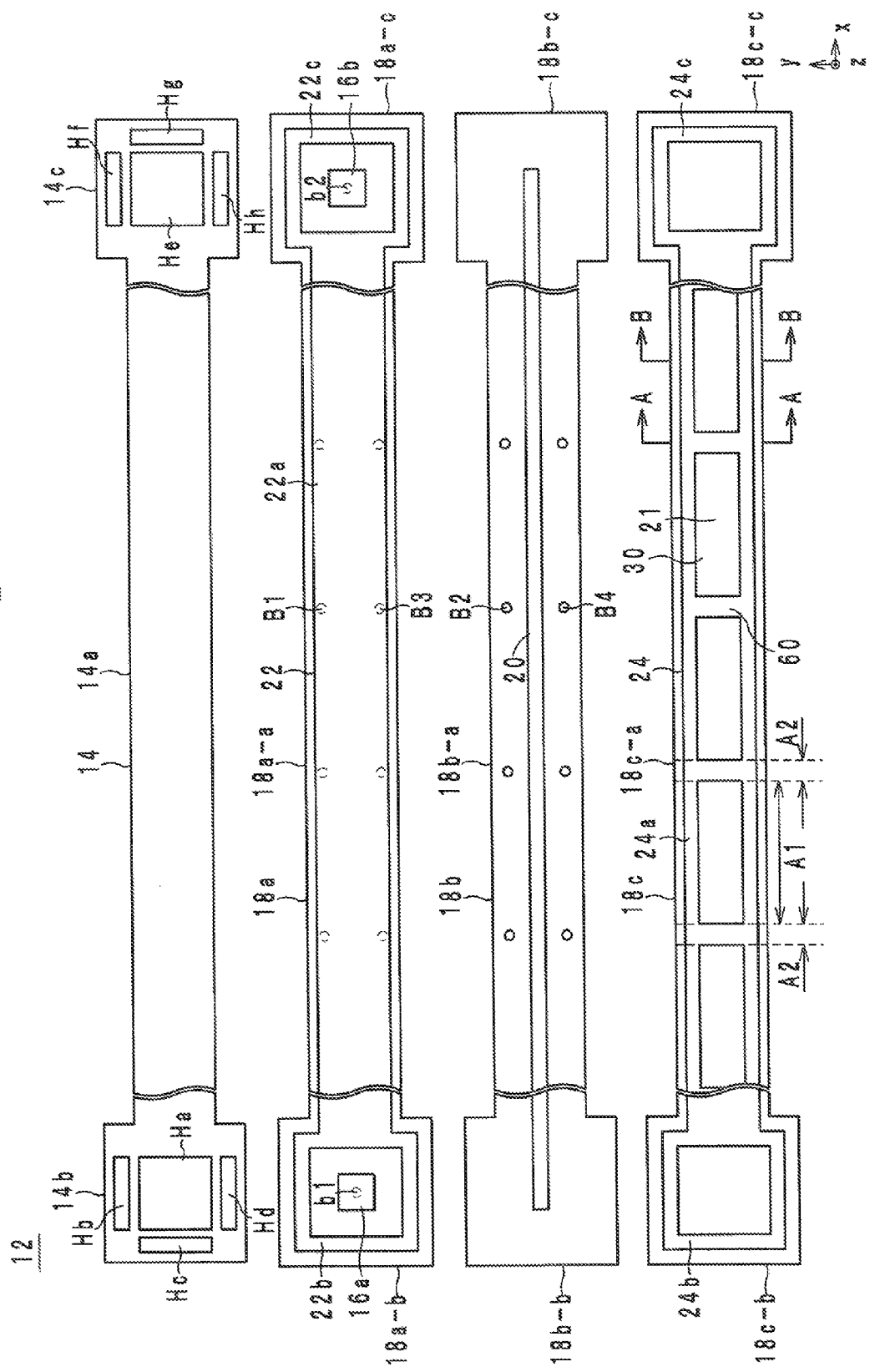
FIG. 2 is an exploded view of a dielectric element assembly of the high-frequency signal line in FIG. 1.
Figure 3:
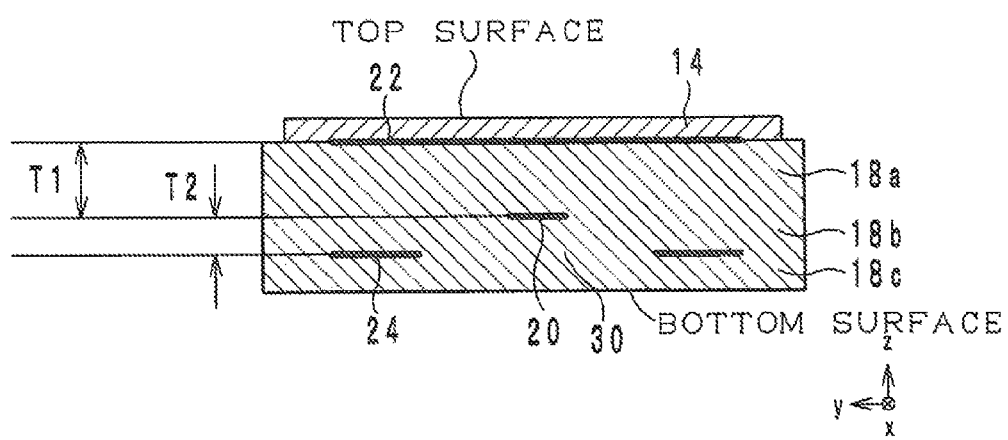
FIG. 3 is a cross-sectional structure view taken along line A-A in FIG. 2.

The configuration of a high-frequency signal line according to a preferred embodiment of the present invention will be described below with reference to the drawings. FIG. 1 is an external oblique view of the high-frequency signal line 10 according to a preferred embodiment of the present invention. FIG. 2 is an exploded view of a dielectric element assembly 12 of the high-frequency signal line 10 in FIG. 1. FIG. 3 is a cross-sectional structure view of the high-frequency signal line 10 taken along line A-A in FIG. 2. FIG.

4 is a cross-sectional structure view of the high-frequency signal line 10 taken along line B-B in FIG. 2. In the following, the stacking direction of the high-frequency signal line 10 will be defined as the z-axis direction. Moreover, the longitudinal direction of the high-frequency signal line 10 will be defined as the x-axis direction, and the direction perpendicular to the x-axis and z-axis directions will be defined as the y-axis direction.

The high-frequency signal line 10 is a flexible board preferably used in, for example, an electronic device such as a cell phone to connect two high-frequency circuits. The high-frequency signal line 10 includes the dielectric element assembly 12, external terminals 16a and 16b, a signal line 20, a reference ground conductor 22, an auxiliary ground conductor 24, via-hole conductors b1, b2, B1, B2, B3, and B4, and connectors 100a and 100b, as shown in FIGS. 1 through 3.

The dielectric element assembly 12 is a flexible plate-shaped member extending in the x-axis direction when viewed in a plan view in the z-axis direction, and includes a line portion 12a and connecting portions 12b and 12c, as shown in FIG. 1. The dielectric element assembly 12 includes a stack of layers, including a protective layer 14 and dielectric sheets 18a, 18b, and 18c, which are stacked in this order from the positive side to the negative side in the z-axis direction, as shown in FIG. 2. In the following, the principal surface of the dielectric element assembly 12 that is located on the positive side in the z-axis direction will be referred to as a top surface (second principal surface), and the principal surface of the dielectric element assembly 12 that is located on the negative side in the z-axis direction will be referred to as a bottom surface (first principal surface).

The line portion 12a extends in the x-axis direction, as shown in FIG. 1. The connecting portions 12b and 12c are in the shape of rectangles respectively connected to the ends of the line portion 12a on the negative and positive sides in the x-axis direction. The width of each of the connecting portions 12b and 12c in the y-axis direction is greater than the width of the line portion 12a in the y-axis direction.

The dielectric sheets 18a to 18c, when viewed in a plan view in the z-axis direction, extend in the x-axis direction and have the same shape as the dielectric element assembly 12, as shown in FIG. 2. The dielectric sheets 18a to 18c are flexible sheets of thermoplastic resin such as polyimide or liquid crystal polymer. In the following, the principal surfaces of the dielectric sheets 18a to 18c that are located on the positive side in the z-axis direction will be referred to as top surfaces, and the principal surfaces of the dielectric sheets 18a to 18c that are located on the negative side in the z-axis direction will be referred to as bottom surfaces.

Figure 4:
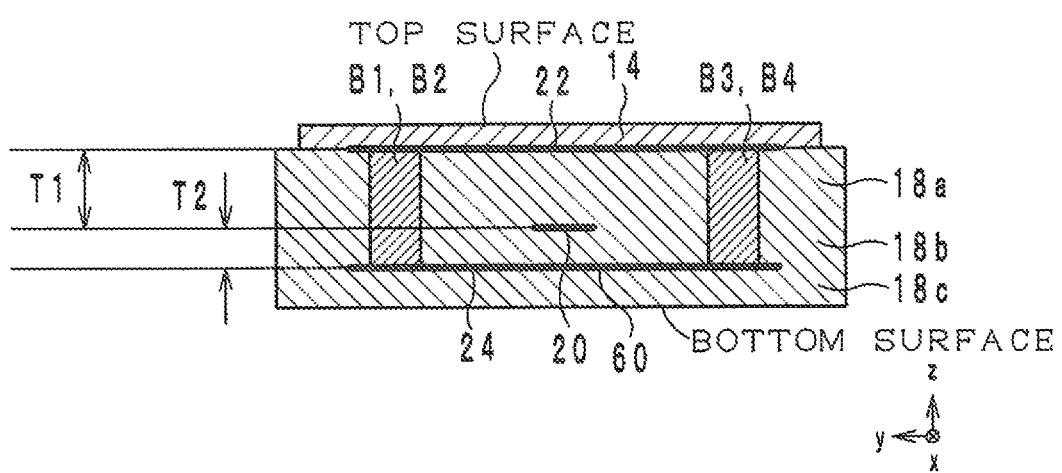
FIG. 4 is a cross-sectional structure view taken along line B-B in FIG. 2.

The thickness T1 of the dielectric sheet 18a is greater than the thickness T2 of the dielectric sheet 18b, as shown in FIGS. 3 and 4. After the stacking of the dielectric sheets 18a to 18c, the thickness T1 is, for example, from about 50 μm to about 300 μm. In the present preferred embodiment, the thickness T1 preferably is about 150 μm, for example. Moreover, the thickness T2 preferably is, for example, from about 10 μm to about 100 μm. In the present preferred embodiment, the thickness T2 preferably is about 50 μm, for example. Moreover, the thickness of the dielectric sheet 18c preferably is about 25 μm, for example.

Furthermore, the dielectric sheet 18a includes a line portion 18a-a and connecting portions 18a-b and 18a-c, as shown in FIG. 2. The dielectric sheet 18b includes a line portion 18b-a and connecting portions 18b-b and 18b-c, as shown in FIG. 2. The dielectric sheet 18c includes a line portion 18c-a and connecting portions 18c-b and 18c-c. The line portions 18a-a, 18b-a, and 18c-a define the line portion 12a. The connecting portions 18a-b, 18b-b, and 18c-b define the connecting portion 12b. The connecting portions 18a-c, 18b-c, and 18c-c define the connecting portion 12c.

The signal line 20 is a linear conductor provided in the dielectric element assembly 12 for the purpose of high-frequency signal transmission, as shown in FIGS. 2 through 4. In the present preferred embodiment, the signal line 20 is a linear conductor provided on the top surface of the dielectric sheet 18b and extending in the x-axis direction. Moreover, the signal line 20 is positioned closer to the bottom surface of the dielectric element assembly 12 than to the top surface of the dielectric element assembly 12, as shown in FIGS. 3 and 4.

The end of the signal line 20 that is located on the negative side in the x-axis direction is positioned essentially at the center of the connecting portion 18b-b, as shown in FIG. 2. The end of the signal line 20 that is located on the positive side in the x-axis direction is positioned essentially at the center of the connecting portion 18b-c, as shown in FIG. 2. The signal line 20 is made of a metal material mainly composed of silver or copper and having a low specific resistance. Here, the signal line 20 is provided on the top surface of the dielectric sheet 18b preferably by patterning metal foil formed by plating the top surface of the dielectric sheet 18b or by patterning metal foil attached to the top surface of the dielectric sheet 18b. Moreover, the top surface of the signal line 20 is smoothened, so that surface roughness of the signal line 20 is greater on the side that contacts the dielectric sheet 18b than on the side that does not contact the dielectric sheet 18b.

The reference ground conductor (second ground conductor) 22 is a planar conductor layer provided at a side of the top surface of the dielectric element assembly 12 with respect to the signal line 20, as shown in FIGS. 2 through 4. More specifically, the reference ground conductor 22 is provided on the top surface of the dielectric sheet 18a so as to be opposed to the signal line 20 with respect to the dielectric sheet 18a. The reference ground conductor 22 has no openings overlapping with the signal line 20. The reference ground conductor 22 is made of a metal material mainly composed of silver or copper and having a low specific resistance.

Here, the reference ground conductor 22 is provided on the top surface of the dielectric sheet 18a by patterning metal foil formed by plating the top surface of the dielectric sheet 18a or by patterning metal foil attached to the top surface of the dielectric sheet 18a. Moreover, the top surface of the reference ground conductor 22 is smoothened, so that surface roughness of the reference ground conductor 22 is greater on the side that contacts the dielectric sheet 18a than on the side that does not contact the dielectric sheet 18a.

Furthermore, the reference ground conductor 22 includes a primary conductor 22a and terminal conductors 22b and 22c, as shown in FIG. 2. The primary conductor 22a is provided on the top surface of the line portion 18a-a, and extends in the x-axis direction. The terminal conductor 22b is provided in the form of a rectangular or substantially rectangular frame on the top surface of the connecting portion 18a-b. The terminal conductor 22b is connected to the end of the primary conductor 22a on the negative side in the x-axis direction. The terminal conductor 22c is provided in the form of a rectangular or substantially rectangular frame on the top surface of the connecting portion 18a-c. The terminal conductor 22c is connected to the end of the primary conductor 22a on the positive side in the x-axis direction.

Here, the characteristic impedance of the high-frequency signal line 10 is determined mainly by the opposed areas of the signal line 20 and the reference ground conductor 22 and the distance therebetween, as well as by the relative permittivities of the dielectric sheets 18a to 18d. Therefore, in the case where the characteristic impedance of the high-frequency signal line 10 is to be set to about 50Ω, for example, the characteristic impedance of the high-frequency signal line 10 is designed to become about 55Ω, slightly higher than about 50Ω, because of the influence of the signal line 20 and the reference ground conductor 22. Moreover, the auxiliary conductor 24 is shaped (considering, for example, the size of each opening 30) and positioned, as will be described later, such that the characteristic impedance of the high-frequency signal line 10 becomes about 50Ω because of the influence of the signal line 20, the reference ground conductor 22, and the auxiliary ground conductor 24. The reference ground conductor 22 fulfills its role, as described above.

The auxiliary ground conductor (first ground conductor) 24 is a conductor layer provided at a side of the bottom surface of the dielectric element assembly 12 with respect to the signal line 20, as shown in FIG. 2. More specifically, the auxiliary ground conductor 24 is provided on the top surface of the dielectric sheet 18c so as to be opposed to the signal line 20 with respect to the dielectric sheet 18b. The auxiliary ground conductor 24 is made of a metal material mainly composed of silver or copper and having a low specific resistance.

Here, the auxiliary ground conductor 24 is provided on the top surface of the dielectric sheet 18c preferably by patterning metal foil formed by plating the top surface of the dielectric sheet 18c or by patterning metal foil attached to the top surface of the dielectric sheet 18c. Moreover, the top surface of the auxiliary ground conductor 24 is smoothened, so that surface roughness of the auxiliary ground conductor 24 is greater on the side that contacts the dielectric sheet 18c than on the side that does not contact the dielectric sheet 18c.

Furthermore, the auxiliary ground conductor 24 includes a primary conductor 24a and terminal conductors 24b and 24c, as shown in FIG. 2. The primary conductor 24a is provided on the top surface of the line portion 18c-a, and extends in the x-axis direction. The terminal conductor 24b is provided in the form of a rectangular or substantially rectangular frame on the top surface of the connecting portion 18c-b. The terminal conductor 24b is connected to the end of the primary conductor 24a on the negative side in the x-axis direction. The terminal conductor 24c is provided in the form of a rectangular or substantially rectangular frame on the top surface of the connecting portion 18c-c. The terminal conductor 24c is connected to the end of the primary conductor 24a on the positive side in the x-axis direction.

Furthermore, the primary conductor 24a includes a plurality of rectangular or substantially rectangular openings arranged in the x-axis direction, as shown in FIG. 2. Accordingly, the primary conductor 24a has a ladder-shaped configuration. In addition, the auxiliary ground conductor 24 includes portions situated between neighboring openings 30, and such portions will be referred to below as bridge portions 60. The bridge portions 60 extend in the y-axis direction. The openings 30 and the bridge portions 60, when viewed in a plan view in the z-axis direction, alternately overlap with the signal line 20. In the present preferred embodiment, the signal line 20 extends in the x-axis direction so as to cross the centers of the openings 30 and the bridge portions 60 in the y-axis direction.

The auxiliary ground conductor 24 also defines and functions as a shield. Moreover, the auxiliary ground conductor is designed so as to make a final adjustment of the characteristic impedance of the high-frequency signal line 10 to about 50Ω, for example, as described earlier.

In this manner, the auxiliary ground conductor 24 is provided with the openings 30 whereas the reference ground conductor 22 has no openings. Accordingly, the auxiliary ground conductor 24 is smaller in area opposed to the signal line 20 than the reference ground conductor 22.

The external terminal 16a is a rectangular or substantially rectangular conductor located at the center on the top surface of the connecting portion 18a-b, as shown in FIG. 2. Accordingly, the external terminal 16a, when viewed in a plan view in the z-axis direction, overlaps with the end of the signal line 20 that is located on the negative side in the x-axis direction. The external terminal 16b is a rectangular or substantially rectangular conductor located at the center on the top surface of the connecting portion 18a-c, as shown in FIG. 2. Accordingly, the external terminal 16b, when viewed in a plan view in the z-axis direction, overlaps with the end of the signal line 20 that is located on the positive side in the x-axis direction. The external terminals 16a and 16b are preferably formed by plating metal materials with Ni and Au, the metal materials being mainly composed of silver or copper and having a low specific resistance.

Here, the external terminals 16a and 16b are provided on the top surface of the dielectric sheet 18a preferably by patterning metal foil formed by plating the top surface of the dielectric sheet 18a or by patterning metal foil attached to the top surface of the dielectric sheet 18a. Moreover, the top surfaces of the external terminals 16a and 16b are smoothened, so that surface roughness of the external terminals 16a and 16b is greater on the side that contacts the dielectric sheet 18a than on the side that does not contact the dielectric sheet 18a.

The external terminals 16a and 16b, the signal line 20, the reference ground conductor 22, and the auxiliary ground conductor 24 are equal or approximately equal in thickness. The external terminals 16a and 16b, the signal line 20, the reference ground conductor 22, and the auxiliary ground conductor 24 have a thickness of, for example, from about 10 μm to about 20 μm.

As described above, the signal line 20 is positioned between the reference ground conductor 22 and the auxiliary ground conductor 24 in the z-axis direction. That is, the signal line 20, the reference ground conductor 22, and the auxiliary ground conductor 24 define a tri-plate stripline structure. Moreover, the gap between the signal line 20 and the reference ground conductor 22 (i.e., the distance therebetween in the z-axis direction) is, for example, from about 50 μm to about 300 μm, which is equal or approximately equal to the thickness T1 of the dielectric sheet 18a, as shown in FIGS. 3 and 4. In the present preferred embodiment, the gap between the signal line 20 and the reference ground conductor 22 preferably is about 150 μm. On the other hand, the gap between the signal line 20 and the auxiliary ground conductor 24 (i.e., the distance therebetween in the z-axis direction) is, for example, from about 10 μm to about 100 μm, which is equal or approximately equal to the thickness T2 of the dielectric sheet 18b, as shown in FIGS. 3 and 4. In the present preferred embodiment, the gap between the signal line 20 and the auxiliary ground conductor 24 preferably is about 50 μm. That is, the distance between the signal line 20 and the auxiliary ground conductor 24 in the z-axis direction is shorter than the distance between the signal line 20 and the reference ground conductor 22 in the z-axis direction.

The via-hole conductors B1 are arranged in a line at equal intervals in the x-axis direction on the positive side in the y-axis direction relative to the signal line 20, and pass through the dielectric sheet 18a in the z-axis direction, as shown in FIG. 2. The via-hole conductors B2 are arranged in a line at equal intervals in the x-axis direction on the positive side in the y-axis direction relative to the signal line 20, and pass through the dielectric sheet 18b in the z-axis direction, as shown in FIG. 2. The via-hole conductors B1 and B2 are connected in pairs, each defining a single via-hole conductor. In addition, the end of each via-hole conductor B1 that is located on the positive side in the z-axis direction is connected to the reference ground conductor 22. The end of each via-hole conductor B2 that is located on the negative side in the z-axis direction is connected to the auxiliary ground conductor 24; more specifically, the end is connected to the auxiliary ground conductor 24 on the positive side in the y-axis direction relative to the bridge portion 60. The via-hole conductors B1 and B2 are preferably formed by filling through-holes provided in the dielectric sheets 18a and 18b with a conductive paste mainly composed of silver, tin, copper, or the like, and solidifying the conductive paste.

The via-hole conductors B3 are arranged in a line at equal intervals in the x-axis direction on the negative side in the y-axis direction relative to the signal line 20, and pass through the dielectric sheet 18a in the z-axis direction, as shown in FIG. 2. The via-hole conductors B4 are arranged in a line at equal intervals in the x-axis direction on the negative side in the y-axis direction relative to the signal line 20, and pass through the dielectric sheet 18b in the z-axis direction, as shown in FIG. 2. The via-hole conductors B3 and B4 are connected in pairs, each defining a single via-hole conductor. In addition, the end of each via-hole conductor B3 that is located on the positive side in the z-axis direction is connected to the reference ground conductor 22. The end of each via-hole conductor B4 that is located on the negative side in the z-axis direction is connected to the auxiliary ground conductor 24; more specifically, the end is connected to the auxiliary ground conductor 24 on the negative side in the y-axis direction relative to the bridge portion 60. The via-hole conductors B3 and B4 are preferably formed by filling through-holes provided in the dielectric sheets 18a and 18b with a conductive paste mainly composed of silver, tin, copper, or the like, and solidifying the conductive paste.

The via-hole conductor b1 passes through the connecting portion 18a-b of the dielectric sheet 18a in the z-axis direction so as to connect the external terminal 16a to the end of the signal line 20 that is located on the negative side in the x-axis direction, as shown in FIG. 2. The via-hole conductor b2 passes through the connecting portion 18a-c of the dielectric sheet 18a in the z-axis direction so as to connect the external terminal 16b to the end of the signal line 20 that is located on the positive side in the x-axis direction, as shown in FIG. 2. In this manner, the signal line 20 is connected between the external terminals 16a and 16b. The via-hole conductors b1 and b2 are preferably formed by filling through-holes provided in the dielectric sheets 18a and 18b with a conductive paste mainly composed of silver, tin, copper, or the like, and solidifying the conductive paste.

The protective layer 14 is an insulating film provided on the top surface of the dielectric sheet 18a and covering approximately the entire top surface of the dielectric sheet 18a. Accordingly, the protective layer 14 covers the reference ground conductor 22 as the top surface of the dielectric element assembly 12. The protective layer 14 is made of, for example, a flexible resin such as a resist material, and has a higher relative permittivity than the dielectric sheets 18a to 18c (i.e., the entire dielectric element assembly 12 excluding the protective layer 14). The protective layer 14 preferably has a thickness of about 30 μm, for example.

Furthermore, the protective layer 14 includes a line portion 14a and connecting portions 14b and 14c, as shown in FIG. 2. The line portion 14a covers the entire top surface of the line portion 18a-a, including the primary conductor 22a.

The connecting portion 14b is connected to the end of the line portion 14a on the negative side in the x-axis direction, so as to cover the top surface of the connecting portion 18a-b. The connecting portion 14b includes openings Ha, Hb, Hc, and Hd provided therein. The opening Ha is a rectangular or substantially rectangular opening positioned at the center of the connecting portion 14b. The external terminal 16a is exposed to the outside from the opening Ha. The opening Hb is a rectangular or substantially rectangular opening positioned on the positive side in the y-axis direction relative to the opening Ha. The opening Hc is a rectangular or substantially rectangular opening positioned on the negative side in the x-axis direction relative to the opening Ha. The opening Hd is a rectangular or substantially rectangular opening positioned on the negative side in the y-axis direction relative to the opening Ha. The terminal conductor 22b is exposed to the outside from the openings Hb to Hd, so that the exposed portions define and function as external terminals.

The connecting portion 14c is connected to the end of the line portion 14a on the positive side in the x-axis direction, so as to cover the top surface of the connecting portion 18a-c. The connecting portion 14c includes openings He, Hf, Hg, and Hh provided therein. The opening He is a rectangular or substantially rectangular opening positioned at the center of the connecting portion 14c. The external terminal 16b is exposed to the outside from the opening He. The opening Hf is a rectangular or substantially rectangular opening positioned on the positive side in the y-axis direction relative to the opening He. The opening Hg is a rectangular or substantially rectangular opening positioned on the positive side in the x-axis direction relative to the opening He. The opening Hh is a rectangular or substantially rectangular opening positioned on the negative side in the y-axis direction relative to the opening He. The terminal conductor 22c is exposed to the outside from the openings Hf to Hh, so that the exposed portions serve as external terminals.

The characteristic impedance of the high-frequency signal line 10 switches cyclically between impedance values Z1 and Z2. More specifically, in sections A1 where the signal line overlaps with the openings 30, there is relatively low capacitance generated between the signal line 20 and the auxiliary ground conductor 24. Accordingly, in the sections A1, the characteristic impedance of the high-frequency signal line 10 takes the impedance value Z1, which is relatively high.

On the other hand, in sections A2 where the signal line 20 overlaps with the bridge portions 60, there is relatively high capacitance generated between the signal line 20 and the auxiliary ground conductor 24. Accordingly, in the sections A2, the characteristic impedance of the high-frequency signal line 10 takes the impedance value Z2, which is relatively low. The sections A1 and A2 alternate with each other in the x-axis direction. Accordingly, the characteristic impedance of the high-frequency signal line 10 switches cyclically between the impedance values Z1 and Z2. The impedance value Z1 is, for example, 55Ω, and the impedance value Z2 is, for example, about 45Ω. Moreover, the average characteristic impedance of the entire high-frequency signal line 10 is, for example, about 50Ω.

Figure 5:
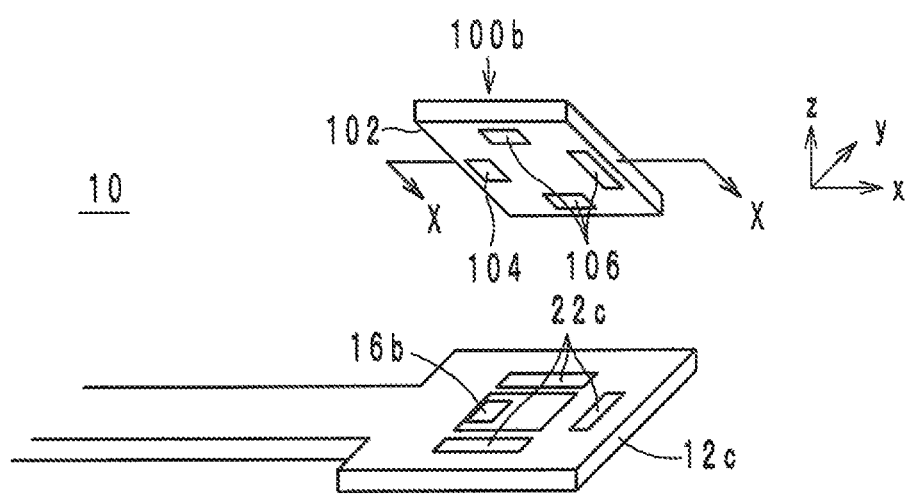
FIG. 5 is an external oblique view of a connector of the high-frequency signal line.
Figure 6:
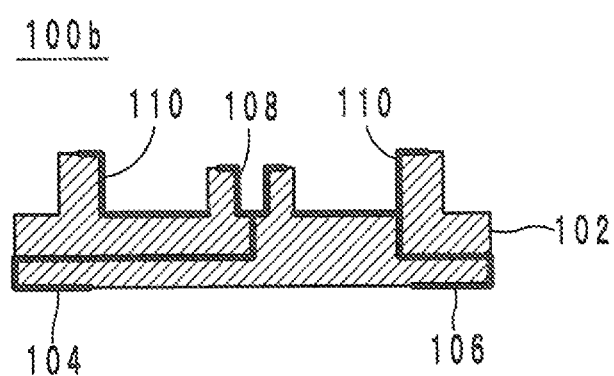
FIG. 6 is a cross-sectional structure view of the connector of the high-frequency signal line.

The connectors 100a and 100b are respectively mounted on the top surfaces of the connecting portions 12b and 12c, as shown in FIG. 1. The connectors 100a and 100b have the same configuration, and therefore, only the configuration of the connector 100b will be described below as an example. FIG. 5 is an oblique external view of the connector 100b of the high-frequency signal line 10. FIG. 6 is a cross-sectional structure view of the connector 100b.

The connector 100b includes a connector body 102, external terminals 104 and 106, a center conductor 108, and an external conductor 110, as shown in FIGS. 1, 5, and 6. The connector body 102 includes a rectangular or substantially rectangular plate and a cylindrical portion coupled thereon, and is made of an insulating material such as resin.

The external terminal 104 is positioned on the plate of the connector body 102 on the negative side in the z-axis direction, so as to face the external terminal 16b. The external terminal 106 is positioned on the plate of the connector body 102 on the negative side in the z-axis direction, so as to correspond to the portions of the terminal portion 22c that are exposed from the openings Hf to Hh.

The center conductor 108 is positioned at the center of the cylindrical portion of the connector body 102, and is connected to the external terminal 104. The center conductor 108 is a signal terminal to/from which a high-frequency signal is inputted/outputted. The external conductor 110 is positioned on the inner circumferential surface of the cylindrical portion of the connector body 102, and is connected to the external terminal 106. The external conductor 110 is a ground terminal to be kept at a ground potential.

The connector 100b is mounted on the top surface of the connecting portion 12c, such that the external terminal 104 is connected to the external terminal 16b, and the external terminal 106 is connected to the terminal portion 22c, as shown in FIGS. 5 and 6. As a result, the signal line 20 is electrically connected to the center conductor 108. In addition, the reference ground conductor 22 and the auxiliary ground conductor 24 are electrically connected to the external conductor 110.

Figure 7:
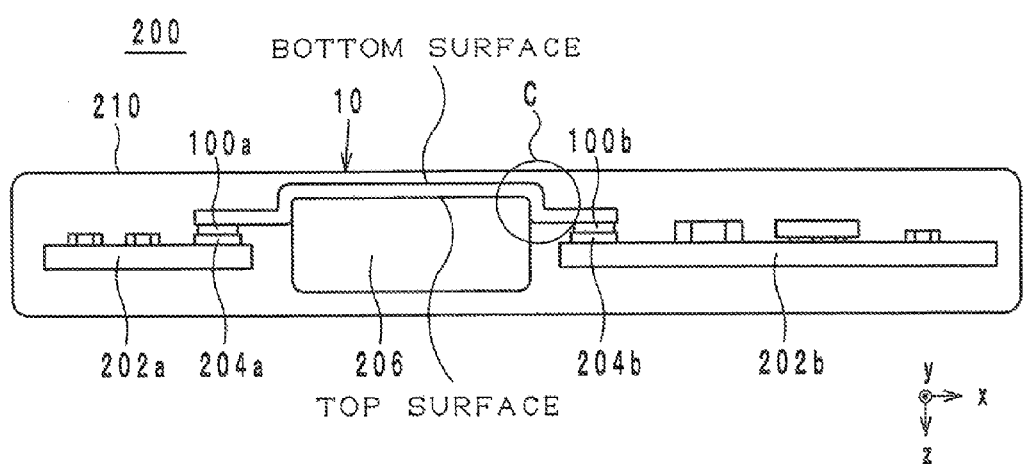
FIG. 7 illustrates an electronic device provided with the high-frequency signal line as viewed in a plan view in the y-axis direction.
Figure 8:
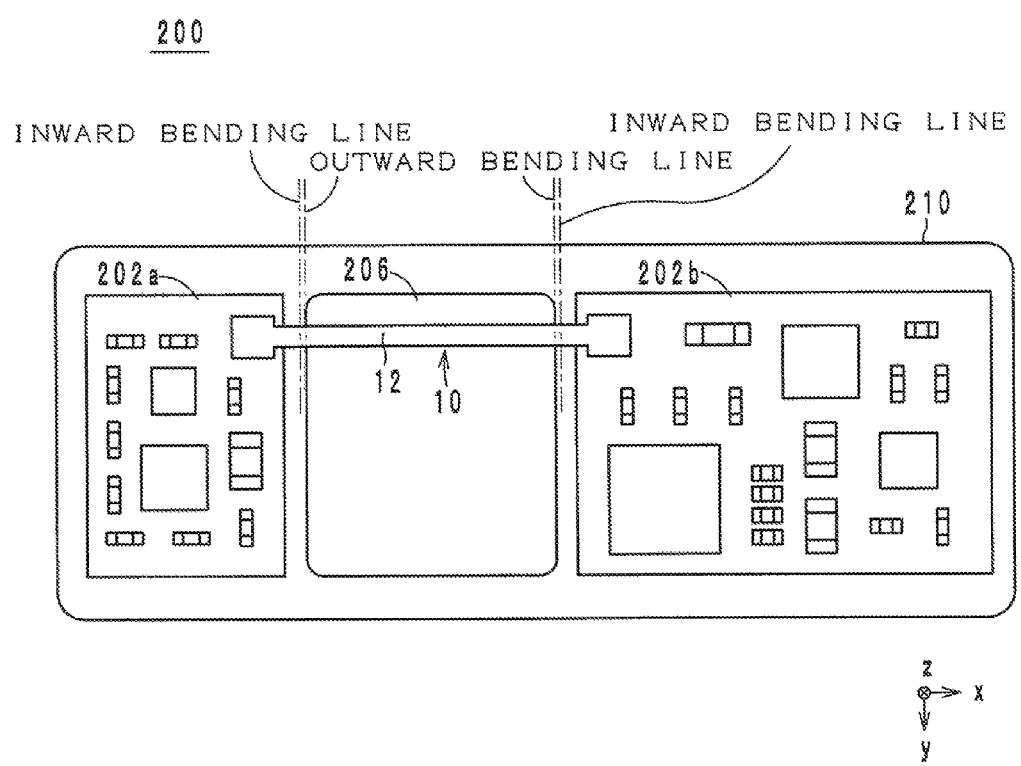
FIG. 8 illustrates the electronic device as viewed in a plan view in the z-axis direction.
Figure 9:
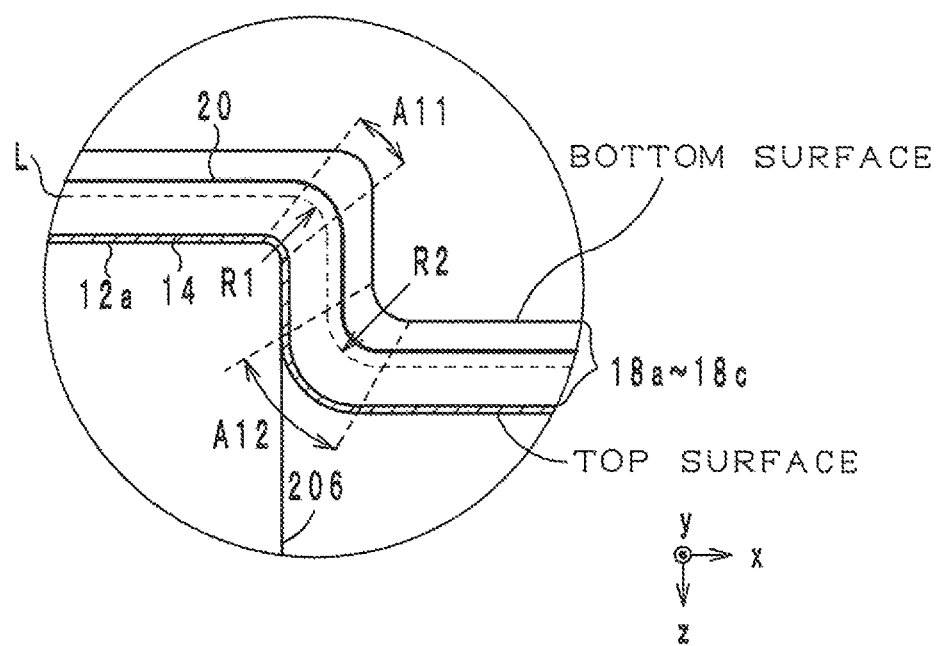
FIG. 9 is an enlarged view of a circled portion at C in FIG. 7.

The high-frequency signal line 10 is preferably used in a manner as will be described below. FIG. 7 illustrates an electronic device 200 provided with the high-frequency signal line 10 as viewed in a plan view in the y-axis direction. FIG. 8 illustrates the electronic device 200 as viewed in a plan view in the z-axis direction. FIG. 9 is an enlarged view of a circled portion at C in FIG. 7.

The electronic device 200 includes the high-frequency signal line 10, circuit boards 202a and 202b, receptacles 204a and 204b, a battery pack (metallic body) 206, and a housing 210.

The housing 210 is a metallic body accommodating the high-frequency signal line 10, the circuit boards 202a and 202b, the receptacles 204a and 204b, and the battery pack 206, as shown in FIGS. 7 and 8. For example, the circuit board 202a has provided thereon a transmission or reception circuit including an antenna. The circuit board 202b has, for example, a power circuit provided thereon. The battery pack 206 is, for example, a lithium-ion secondary battery, and the surface thereof is wrapped by a metal cover. The circuit board 202a, the battery pack 206, and the circuit board 202b are arranged in this order, from the negative side to the positive side in the x-axis direction.

The receptacles 204a and 204b are respectively provided on the principal surfaces of the circuit boards 202a and 202b on the negative side in the z-axis direction. The receptacles 204a and 204b are respectively connected to the connectors 100a and 100b.

Since the receptacles 204a and 204b are respectively connected to the connectors 100a and 100b, as described above, high-frequency signals to be transmitted between the circuit boards 202a and 202b at a frequency of, for example, 2 GHz are applied to the center conductors 108 of the connectors 100a and 100b via the receptacles 204a and 204b, respectively. Moreover, the external conductors 110 of the connectors 100a and 100b are kept at a ground potential by the circuit boards 202a and 202b and the receptacles 204a and 204b. Thus, the high-frequency signal line 10 connects the circuit boards 202a and 202b.

The line portion 12a is bent as will be described below. The line portion 12a is bent outwardly with respect to the bottom surface of the dielectric element assembly 12 in a place on the positive side in the x-axis direction relative to the center along an outward bending line crossing the signal line 20 (in the present preferred embodiment, perpendicularly), as shown in FIGS. 7 and 8. As a result, the dielectric element assembly 12 follows the surface of the battery pack 206 on the negative side in the z-axis direction and also the side surface of the battery pack 206 on the positive side in the x-axis direction. Such an outwardly bent portion of the dielectric element assembly 12 will be referred to below as a section A11, as shown in FIG. 9.

Furthermore, the line portion 12a is bent inwardly with respect to the bottom surface of the dielectric element assembly 12 in a place on the positive side in the x-axis direction relative to the section A11 along an inward bending line crossing the signal line 20 (in the present preferred embodiment, perpendicularly), as shown in FIGS. 7 and 8. As a result, the dielectric element assembly 12 leads from the side surface of the battery pack 206 on the positive side in the x-axis direction onto the principal surface of the circuit board 202b on the negative side in the z-axis direction. Such an inwardly bent portion of the dielectric element assembly 12 will be referred to below as a section A12, as shown in FIG. 9.

The mean value for the radius of curvature R2 in the sections A12 of the dielectric element assembly 12 is greater than the mean value for the radius of curvature R1 in the sections A11 of the dielectric element assembly 12, as shown in FIG. 9. In the present preferred embodiment, the term "radius of curvature" is intended to mean the radius of curvature of an imaginary line L passing through the center of the dielectric element assembly 12 in the z-axis direction. Since the high-frequency signal line 10 has the above structure, the characteristic impedance of the high-frequency signal line 10 is prevented from varying from a target impedance value in the bent portions (i.e., the sections A11 and A12), as will be described later.

Furthermore, the line portion 12a is bent in one place outwardly and in another place inwardly with respect to the dielectric element assembly 12 on the negative side in the x-axis direction relative to the center, as is bent on the positive side in the x-axis direction relative to the center. The manner of bending the line portion 12a in the vicinity of the end on the negative side in the x-axis direction is the same as the manner of bending the line portion 12a in the vicinity of the end on the positive side in the x-axis direction, and therefore, any description thereof will be omitted herein.

Here, the battery pack 206 is in contact with the top surface of the dielectric element assembly 12 (more precisely, the protective layer 14) in a section between the two sections A12 where the bottom surface of the dielectric element assembly 12 is bent inwardly. Accordingly, the battery pack 206 is in contact with the top surface of the dielectric element assembly 12 in the sections A11. The dielectric element assembly 12 and the battery pack 206 are fixed by an adhesive or the like. Accordingly, the reference ground conductor 22, which is in the form of a planar with no openings provided therein, is positioned between the signal line 20 and the battery pack 206.

Figure 10:
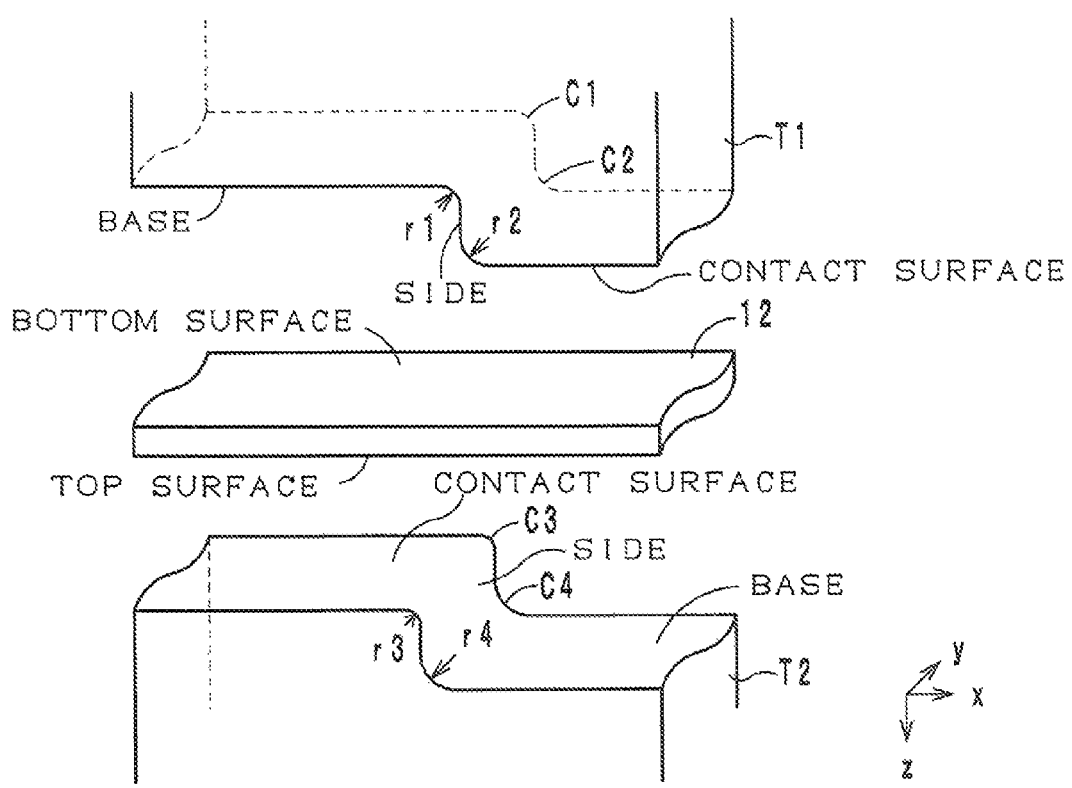
FIG. 10 is a diagram illustrating the step of bending the high-frequency signal line.

A non-limiting example of the method for producing the high-frequency signal line 10 will be described below with reference to the drawings. FIG. 10 is a diagram illustrating the step of bending the high-frequency signal line 10. While the following description focuses on one high-frequency signal line 10 as an example, in actuality, large-sized dielectric sheets are stacked and cut, so that a plurality of high-frequency signal lines 10 are produced at the same time.

Prepared first are dielectric sheets 18a, 18b, and 18c, each being made of a thermoplastic resin and copper-foiled on one principal surface. More specifically, copper foil is attached to the principal surface of each of the dielectric sheets 18a to 18c. Further, the copper-foiled surfaces of the dielectric sheets 18a to 18c are smoothened, for example, by galvanization for rust prevention. The dielectric sheets 18a to 18c are sheets of liquid crystal polymer. The thickness of the copper foil preferably is from about 10 μm to about 20 μm, for example.

Next, external terminals 16a and 16b and a reference ground conductor 22, as shown in FIG. 2, are formed on the surface of the dielectric sheet 18a by patterning the copper-foiled surface of the dielectric sheet 18a. Specifically, resists are printed on the copper-foiled surface of the dielectric sheet 18a in the same shapes as the external terminals 16a and 16b and the reference ground conductor 22 shown in FIG. 2. Then, any portions of the copper foil that are not coated with the resists are removed by etching the copper foil. Thereafter, the resists are removed by spraying a cleaning agent (resist solvent). In this manner, the external terminals 16a and 16b and the reference ground conductor 22, as shown in FIG. 2, are formed on the surface of the dielectric sheet 18a by photolithography.

Next, a signal line 20, as shown in FIG. 2, is provided on the surface of the dielectric sheet 18b. In addition, an auxiliary ground conductor 24, as shown in FIG. 2, is provided on the surface of the dielectric sheet 18c. Note that the steps for forming the signal line 20 and the auxiliary ground conductor 24 are the same as the steps for forming the external terminals 16a and 16b and the ground conductor 22, and therefore, any descriptions thereof will be omitted herein.

Next, through-holes are provided in the dielectric sheets 18a to 18c by irradiating their surfaces with laser beams where via-hole conductors b1, b2, B1, B2, B3, and B4 are to be formed. Thereafter, the through-holes are filled with a conductive paste.

Next, the dielectric sheets 18a to 18c are stacked in this order, from the positive side to the negative side in the z-axis direction, as shown in FIG. 2, and then subjected to pressing and heating. Through the pressing and the heating, the dielectric sheets 18a to 18c are softened, and the conductive paste in the through-holes is solidified. As a result, the dielectric sheets 18a to 18c are bonded, and the via-hole conductors b1, b2, and B1 to B4 are formed.

Next, a resin (resist) paste is applied to the surface of the dielectric sheet 18a by screen printing, thus forming a protective layer 14 so as to cover the reference ground conductor 22, as shown in FIG. 2.

Next, connectors 100a and 100b are mounted on the connecting portions 12b and 12c by soldering them to the external terminals 16a and 16b and the terminal portions 22b and 22c.

Next, the line portion 12a is sandwiched by crimping tools T1 and T2 from both sides in the z-axis direction, as shown in FIG. 10, thus bending the line portion 12a outwardly and also inwardly in the vicinity of both ends in the x-axis direction. Specifically, the crimping tool T1 has a raised portion to be brought into contact with the bottom surface of the line portion 12a for the outward and inward bending of the line portion 12a. The crimping tool T1 has a corner C1 between the base and the side of the raised portion and also a corner C2 between the side and the contact surface of the raised portion. The corners C1 and C2 are located in this order, from the negative side to the positive side in the x-axis direction. The corners C1 and C2 are chamfered corners. The corner C1 has a radius of curvature r1. In addition, the corner C2 has a radius of curvature r2.

The crimping tool T2 has a raised portion to be brought into contact with the top surface of the line portion 12a for the outward and inward bending of the line portion 12a. The crimping tool T2 has a corner C3 between the side and the contact surface of the raised portion and also a corner C4 between the base and the side of the raised portion. The corners C3 and C4 are located in this order, from the negative side to the positive side in the x-axis direction. The corners C3 and C4 are chamfered corners. The corner C3 has a radius of curvature r3. The mean value for the radius of curvature r3 is lower than the mean value for the radius of curvature r2. In addition, the corner C4 has a radius of curvature r4. The mean value for the radius of curvature r4 is higher than the mean value for the radius of curvature r1.

The crimping tools T1 and T2 thus configured are positioned such that the corners C1 and C3 are approximately aligned in the z-axis direction, and the corners C2 and C4 are approximately aligned in the z-axis direction. Thereafter, the crimping tools T1 and T2 sandwich the line portion 12a from both sides in the z-axis direction. The crimping tools T1 and T2 include heaters, and therefore, the line portion 12a is heated by the crimping tools T1 and T2. As a result, the line portion 12a is bent outwardly and also inwardly. The mean value for the radius of curvature R2 of the section A12 where the dielectric element assembly 12 is bent inwardly is higher than the mean value for the radius of curvature R1 of the section A11 where the dielectric element assembly 12 is bent outwardly. The high-frequency signal line 10 thus bent outwardly and inwardly is connected to the receptacles 204a and 204b.

The high-frequency signal line 10 thus configured renders it possible to prevent the characteristic impedance of the high-frequency signal line 10 from varying from a target impedance value in the sections A11 and A12. More specifically, in the high-frequency signal line 10, the bottom surface of the dielectric element assembly 12 is bent outwardly and also inwardly. In this case, the mean value for the radius of curvature R2 of the section A12 where the dielectric element assembly 12 is bent inwardly is higher than the mean value for the radius of curvature R1 of the section A11 where the dielectric element assembly 12 is bent outwardly. If the signal line 20 is provided on the imaginary line L, the radius of curvature of the signal line 20 is smaller in the section A11 than in the section A12. Accordingly, the signal line 20 is more susceptible to floating capacitance in the section A11 than in the section A12.

Therefore, in the high-frequency signal line 10, the signal line 20 is disposed closer to the bottom surface than to the top surface. As a result, the signal line 20 is positioned on the outer circumferential side relative to the imaginary line L in the section A11, which is relatively susceptible to floating capacitance, as shown in FIG. 9. Accordingly, the radius of curvature of the signal line 20 increases in the section A11, so that floating capacitance is prevented from being generated in the signal line 20 in the section A11. Thus, the characteristic impedance of the high-frequency signal line 10 is prevented from varying from the target impedance value in the section A11.

In the section A12, the signal line 20 is positioned on the inner circumferential side relative to the imaginary line L. However, in the section A12, the radius of curvature R2 is large, and therefore, the signal line 20 is less susceptible to floating capacitance. Accordingly, in the section A12, little floating capacitance is generated in the signal line 20, so that the characteristic impedance barely changes from the target impedance value.

Furthermore, the high-frequency signal line 10 renders it possible to prevent the characteristic impedance from varying from the target impedance value in the section A11, also for the following reasons. Specifically, in the section A11, the battery pack 206, which is a metallic body, is in contact with the top surface of the dielectric element assembly 12. Also, in the section A11, the signal line 20 is positioned on the outer circumferential side relative to the imaginary line L, away from the battery pack 206. Accordingly, floating capacitance is prevented from being generated between the signal line 20 and the battery pack 206. Thus, the characteristic impedance of the high-frequency signal line 10 is prevented from varying from the target impedance value in the section A11.

Furthermore, the high-frequency signal line 10 includes the protective layer 14 provided as the outermost layer of the dielectric element assembly 12 on the positive side in the z-axis direction. Accordingly, the protective layer 14 is located on the innermost side in the section A11. The protective layer 14 has a higher relative permittivity than the dielectric sheets 18a to 18c, and therefore, the signal line 20 might have an increase in floating capacitance generated in the section A11. However, the high-frequency signal line 10 renders it possible to prevent floating capacitance from being generated in the signal line 20 in the section A11, as described earlier, and therefore, floating capacitance barely increases in the signal line 20 even when the protective layer 14 is provided.

Figure 11:
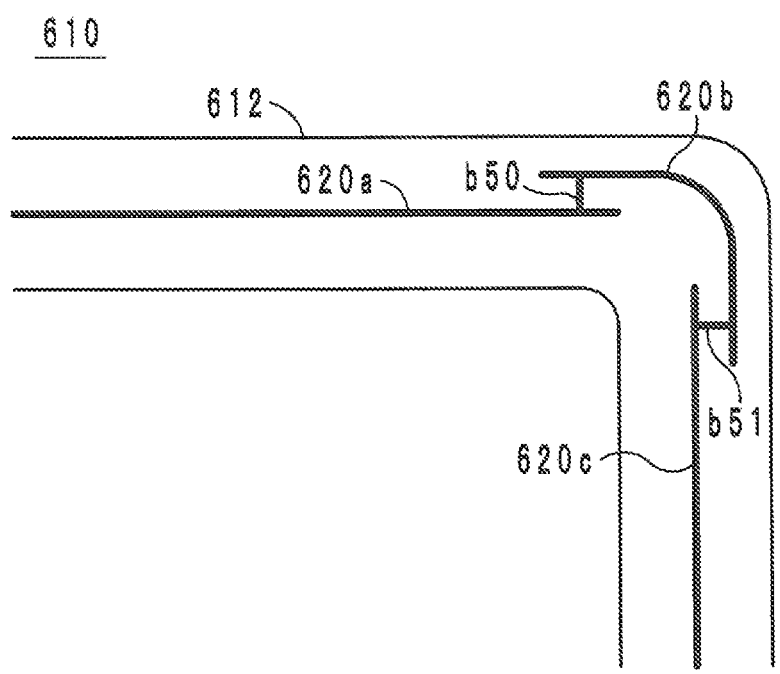
FIG. 11 is a cross-sectional structure view illustrating a bent portion of a high-frequency signal line according to a comparative example.
Figure 12:
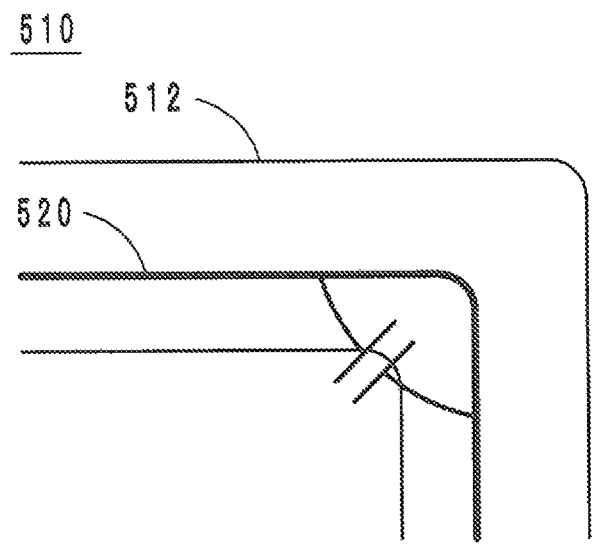
FIG. 12 is a cross-sectional structure view illustrating a bent portion of a high-frequency signal line disclosed in International Publication WO 2012/073591.

Furthermore, the high-frequency signal line 10 renders it possible to suppress or prevent an increase in insertion loss of the high-frequency signal line 10 while preventing the characteristic impedance from varying from the target impedance value in the sections A11 and A12. FIG. 11 is a cross-sectional structure view illustrating a bent portion of a high-frequency signal line 610 according to a comparative example.

The high-frequency signal line 610 according to the comparative example includes a dielectric element assembly 612, signal lines 620a, 620b, and 620c, and via-hole conductors b50 and b51. The signal lines 620a and 620c are provided at the center in the stacking direction of the dielectric element assembly 612. The signal line 620b is positioned on the outer circumferential side in the stacking direction relative to the center when the dielectric element assembly 612 is bent. The via-hole conductor b50 connects the signal lines 620a and 620b. The via-hole conductor b51 connects the signal lines 620b and 620c. In the high-frequency signal line 610 as above, the signal line 620b is positioned on the outer circumferential side in the stacking direction relative to the center at the bend of the high-frequency signal line 610, and therefore, is less susceptible to floating capacitance. Thus, the characteristic impedance of the high-frequency signal line 610 is able to be prevented from varying from a target impedance value at the bend.

In general, the material of the via-hole conductors b50 and b51 preferably has a higher resistivity than the material of the signal lines 620a to 620c. Accordingly, the high-frequency signal line 610 has a problem of increased insertion loss.

Therefore, the high-frequency signal line 10 prevents the characteristic impedance from varying from the target impedance value in the sections A11 and A12 without using such line routing as in the high-frequency signal line 610, which uses the via-hole conductors b50 and b51 for routing of the signal line 620b. Thus, it is possible to suppress or prevent an increase in insertion loss of the high-frequency signal line 10.

Furthermore, the high-frequency signal line 10 can be made thin. More specifically, in the high-frequency signal line 10, the signal line 20, when viewed in a plan view in the z-axis direction, does not overlap with the auxiliary ground conductor 24 in the section A1. Accordingly, less capacitance is generated between the signal line 20 and the auxiliary ground conductor 24. Therefore, even if the distance between the signal line 20 and the auxiliary ground conductor 24 in the z-axis direction is reduced, the capacitance generated between the signal line 20 and the auxiliary ground conductor 24 is prevented from becoming excessively high. As a result, the characteristic impedance of the high-frequency signal line 10 is less likely to deviate from a predetermined impedance value (e.g., about 50Ω). Thus, it is possible to make the high-frequency signal line 10 thin while maintaining the characteristic impedance at the predetermined impedance value.

Furthermore, in the case where the high-frequency signal line 10 is attached to a metallic body such as the battery pack 206, fluctuations in characteristic impedance of the high-frequency signal line 10 are able to be prevented. More specifically, the high-frequency signal line 10 is attached to the battery pack 206, such that the reference ground conductor 22, which is in the form of a planar, is positioned between the signal line 20 and the battery pack 206. Accordingly, the signal line 20 does not face the battery pack 206 through any openings, which prevents capacitance from being generated between the signal line 20 and the battery pack 206. As a result, attaching the high-frequency signal line 10 to the battery pack 206 prevents the characteristic impedance of the high-frequency signal line 10 from being reduced.

Other Preferred Embodiments

The present invention is not limited to the high-frequency signal line 10 and the electronic device 200, and variations can be made within the spirit and scope of the present invention.

The protective layer 14 has been described above as preferably being formed by screen printing, but the protective layer 14 may be formed by photolithography.

Furthermore, the dielectric element assembly 12 may further include a protective layer provided on the bottom surface of the dielectric sheet 18c.

Furthermore, the protective layer 14 has been described above as preferably having a higher relative permittivity than the dielectric sheets 18a to 18c, but the protective layer 14 may have the same relative permittivity as the dielectric sheets 18a to 18c or a lower relative permittivity than the dielectric sheets 18a to 18c.

The high-frequency signal line 10 does not necessarily have the connectors 100a and 100b mounted thereon. In such a case, the high-frequency signal line 10 is connected at its ends to circuit boards by soldering or the like. Note that the high-frequency signal line 10 may have only one of the connectors 100a and 100b mounted on one end.

Furthermore, the connectors 100a and 100b have been described above as being mounted on the top surface of the high-frequency signal line 10, but the connectors 100a and 100b may be mounted on the bottom surface of the high-frequency signal line 10. Alternatively, the connector 100a may be mounted on the top surface of the high-frequency signal line 10, and the connector 100b may be mounted on the bottom surface of the high-frequency signal line 10.

Furthermore, the high-frequency signal line 10 may be provided with only one or neither of the reference ground conductor 22 and the auxiliary ground conductor 24.

Furthermore, the high-frequency signal line 10 may be used on RF circuit boards such as antenna front end modules.

The signal line 20 does not have to be a high-frequency signal transmission line and may be, for example, a power line for use in power supply or a ground line to be kept at a ground potential.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A flexible board comprising:
   a flexible body including a first principal surface and a second principal surface; and a linear conductor provided in the body and located closer to the first principal surface than to the second principal surface; wherein the body is bent inwardly with respect to the first principal surface to include an inward bend along an inward bending line crossing the linear conductor and also outwardly with respect to the first principal surface to include an outward bend along an outward bending line crossing the linear conductor;
   the inward bend of the body has a larger mean curvature radius than the outward bend of the body; and
   a first portion of the body adjacent to the outward bend is parallel or substantially parallel to a second portion of the body adjacent to the inward bend, the first portion and the second portion are at opposite sides of the inward bend and the outward bend.

2. The flexible board according to claim 1, further comprising:
   a first ground conductor provided at a side of the first principal surface with respect to the linear conductor; and
   a second ground conductor provided at a side of the second principal surface with respect to the linear conductor; wherein
   the first ground conductor is less distant from the linear conductor than the second ground conductor is.

3. The flexible board according to claim 2, wherein the first ground conductor is smaller in area opposed to the linear conductor than the second ground conductor is.

4. The flexible board according to claim 1, wherein the body is made of a thermoplastic resin.

5. The flexible board according to claim 1, wherein
   the body includes a protective layer defining and functioning as the second principal surface; and
   the protective layer has a higher relative permittivity than a remainder of the body.

6. The flexible board according to claim 1, wherein the flexible board defines a high-frequency signal line.

7. The flexible board according to claim 1, wherein the body includes a plurality of dielectric sheets.

8. The flexible board according to claim 7, wherein at least two of the plurality of dielectric sheets have different thicknesses.

9. The flexible board according to claim 1, wherein the linear conductor is a signal line defined by a patterned metal foil.

10. The flexible board according to claim 1, wherein one surface of the linear conductor has a roughness that is different from another surface of the linear conductor.

11. The flexible board according to claim 2, wherein one of the first and second ground conductors includes openings and the other of the first and second ground conductors does not include openings.

12. The electronic device according to claim 1, further comprising first and second ground conductors that define a tri-plate stripline structure with the linear conductor.

13. An electronic device comprising: a housing; and a flexible board accommodated in the housing; wherein the flexible board includes; a flexible body including a first principal surface and a second principal surface; and a linear conductor provided in the body and located closer to the first principal surface than to the second principal surface; the body is bent inwardly with respect to the first principal surface to include an inward bend along an inward bending line crossing the linear conductor and also outwardly with respect to the first principal surface to include an outward bend along an outward bending line crossing the linear conductor;
   the inward bend of the body has a larger mean curvature radius than the outward bend of the body; and
   a first portion of the body adjacent to the outward bend is parallel or substantially parallel to a second portion of the body adjacent to the inward bend, the first portion and the second portion are at opposite sides of the inward bend and the outward bend.

14. The electronic device according to claim 13, further comprising a metallic body in contact with the second principal surface in the outward bend of the body.

15. The electronic device according to claim 13, wherein the electronic device is a cell phone.

16. The electronic device according to claim 13, wherein the flexible board defines a high-frequency signal line.

17. The electronic device according to claim 13, wherein the body includes a plurality of dielectric sheets.

18. The electronic device according to claim 17, wherein at least two of the plurality of dielectric sheets have different thicknesses.

19. The electronic device according to claim 13, wherein the linear conductor is a signal line defined by a patterned metal foil.

* * * * *